(12) United States Patent
Mizuguchi

(10) Patent No.: US 6,967,386 B2
(45) Date of Patent: Nov. 22, 2005

(54) MAGNETIC MEMORY DEVICE

(75) Inventor: Tetsuya Mizuguchi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/492,591

(22) PCT Filed: Oct. 9, 2002

(86) PCT No.: PCT/JP02/10481

§ 371 (c)(1),
(2), (4) Date: Sep. 27, 2004

(87) PCT Pub. No.: WO03/036725

PCT Pub. Date: May 1, 2003

(65) Prior Publication Data

US 2005/0029562 A1 Feb. 10, 2005

(30) Foreign Application Priority Data

Oct. 23, 2001 (JP) ............................. 2001-324622

(51) Int. Cl.⁷ ............................................. H01L 29/82
(52) U.S. Cl. ................... 257/422; 257/421; 365/158; 365/171; 365/173; 365/225.5
(58) Field of Search ............................. 257/421, 422, 257/295; 365/158, 171, 173, 225.5

(56) References Cited

U.S. PATENT DOCUMENTS 6,767,655 B2 * 7/2004 Hiramoto et al. ......... 428/811.2
6,815,785 B2 * 11/2004 Ooishi ...................... 257/421
6,842,368 B2 * 1/2005 Hayakawa ................. 365/173
2003/0151079 A1 * 8/2003 Jones et al. ................ 257/295
2004/0041183 A1 * 3/2004 Slaughter et al. .......... 257/295

FOREIGN PATENT DOCUMENTS

| EP | 0936624 | 8/1999 |
| JP | 11-86528 | 3/1999 |
| JP | 11-316919 | 11/1999 |
| JP | 2001-196659 | 7/2001 |
| JP | 2002-26421 | 1/2002 |

* cited by examiner

Primary Examiner—Ngân V. Ngô
(74) Attorney, Agent, or Firm—Sonnenschein, Nath & Rosenthal LLP (57) ABSTRACT

A magnetic memory device can information with a low power consumption by inhibiting the coercive force from being increased by a demagnetizing field in a free layer, regardless of the thickness, moment, and the like of the free layer, even when the size of a magnetoresistive element is reduced. In the magnetic memory device which includes a magnetoresistive element (10) having a free layer (16) composed of a ferromagnetic material, and an electrode layer (22) composed of a nonmagnetic conductor, disposed adjacent to the free layer (16) of the magnetoresistive element (10), and having a part in contact with the free layer (16), and in which the direction of magnetization of the free layer (16) is reversed by a magnetic field generated by the electrode layer (22), a magnetic layer (23) composed of a magnetic material is provided on a part of a surface of the electrode layer (22) adjacent to the free layer (16) and out of contact with the free layer (16) so as to increase the apparent area of the free layer (16).

3 Claims, 9 Drawing Sheets

MAGNETIC MEMORY DEVICE

TECHNICAL FIELD

The present invention relates to magnetic memory devices for use as memory devices for storing information, and more particularly, to a magnetic memory device having a magnetoresistive element that achieves a so-called MR (magnetoresistive) effect in which the resistance varies depending on an externally applied magnetic field.

BACKGROUND OF THE INVENTION

Recently, an MRAM (Magnetic Random Access Memory) has been proposed as one type of magnetic memory device that functions as a memory device. The MRAM stores information by utilizing the reversal of the direction of magnetization in a magnetoresistive element such as a giant magnetoresistive (GMR) or a tunnel magnetoresistive (TMR) element.

In a magnetoresistive element, for example, a TMR element, used in the MRAM, a free layer composed of a ferromagnetic material, a nonmagnetic layer composed of an insulating material, a fixed layer composed of a ferromagnetic material, and an antiferromagnetic layer for directly or indirectly fixing the direction of magnetization of the fixed layer are stacked in order, and the resistance of a tunnel current varies depending on the direction of magnetization of the free layer. Thus, the MRAM can store information according to the direction of magnetization of the free layer in the magnetoresistive element; for example, it stores "1" when the magnetization is oriented in a certain direction, and "0" when the magnetization is oriented in another direction.

In order to write information in the magnetoresistive element, the MRAM also includes an electrode layer composed of a nonmagnetic conductor that is disposed at least adjacent to the free layer in the magnetoresistive element. A magnetic field higher than a magnetic field Hc necessary to reverse the direction of magnetization of the free layer is applied to the magnetoresistive element by a magnetic field generated by an electric current passing through the electrode layer so as to change the direction of magnetization, thereby writing information in the magnetoresistive element.

In such an MRAM, the size (planar area) of the magnetoresistive element tends to decrease, thus increasing the packaging density. Therefore, of course, the size of the free layer that reverses the direction of magnetization (switching) tends to decrease.

However, since the distance between both ends of the free layer, that is, the distance between the magnetic poles in the free layer, decreases with the size reduction of the free layer, a demagnetizing field generated in the free layer increases. The demagnetizing field reduces a magnetic field externally applied to the free layer. For this reason, the demagnetizing field has a large influence on the coercive force in the free layer. When the demagnetizing field increases, a stronger magnetic field must be applied in order that the free layer can perform switching. That is, when the demagnetizing field increases, the amount of current to be applied to the electrode layer to generate a magnetic field in the free layer needs to be increased. As a result, power consumption during information writing increases.

In order to inhibit the coercive force from being increased by such a demagnetizing field, for example, the dependency of the demagnetizing field on the element size may be reduced by decreasing the moment of the free layer (the product of the saturation magnetization Ms of the ferromagnetic material that forms the free layer, and the thickness t of the free layer). This is because the demagnetizing field Hd, the moment Ms×t, and the size W in the direction in which a magnetic field is applied to the magnetoresistive element (normally, the direction of easy axis of magnetization) have a relationship Hd=A×Ms×t/W (A is a proportionality constant). However, the ferromagnetic material that forms the free layer cannot be easily changed because it has a large influence on the MR ratio. For this reason, the free layer needs to be decreased in thickness in order to reduce the moment thereof. However, when the thickness of the free layer is too small (for example, several nanometers), problems may occur: for example, the free layer does not form a continuous film, and the thermal stability decreases. That is, since the thickness reduction of the free layer is limited, it cannot be necessarily said that the increase in coercive force due to the demagnetizing field can be inhibited by the thickness reduction.

Accordingly, an object of the present invention is to provide a magnetic memory device which can inhibit the coercive force of a free layer from being increased by a demagnetizing field, regardless of the thickness, moment, and the like of the free layer so that information can be written with a low power consumption even when the size of the magnetoresistive element is reduced.

SUMMARY OF THE INVENTION

The present invention has been made to achieve the above object, and provides a magnetic memory device including a magnetoresistive element having a free layer composed of a ferromagnetic material, and an electrode layer composed of a nonmagnetic conductor, disposed adjacent to the free layer of the magnetoresistive element, and having a part in contact with the free layer, wherein the direction of magnetization of the free layer is reversed by a magnetic field generated by a current passing through the electrode layer, and wherein a magnetic layer composed of a magnetic material is provided on a part of a surface of the electrode layer adjacent to and out of contact with the free layer.

In the magnetic memory device having the above configuration, since the magnetic layer is provided on a part of the surface of the electrode layer adjacent to and out of contact with the free layer, the magnetic poles at the ends of the free layer are cancelled by the magnetic layer disposed therearound, and the apparent area of the free layer, including the magnetic layer, increases. Therefore, even when the size of the magnetoresistive element is reduced, the demagnetizing field in the free layer will not increase.

DETAILED DESCRIPTION OF THE PRESENTLY PREFERRED EMBODIMENTS

A magnetic memory device according to the present invention will be described below with reference to the drawings. As an example, a description will be given of a case in which the present invention is applied to an MRAM having a single TMR spin-valve element (hereinafter, simply referred to as a "TMR element") as a magnetoresistive element.

[First Embodiment]

Figure 1:
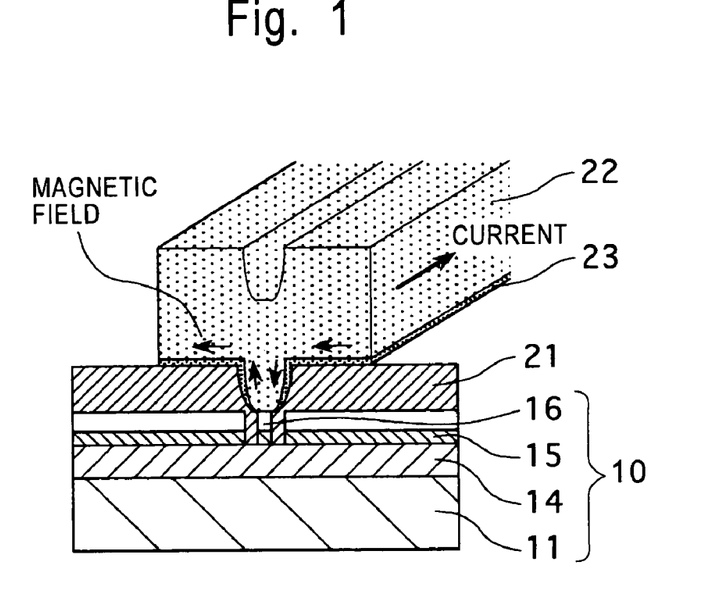
FIG. 1 is a schematic view showing the configuration of the principal part of a first embodiment of a magnetic memory device according to the present invention.
Figure 2:
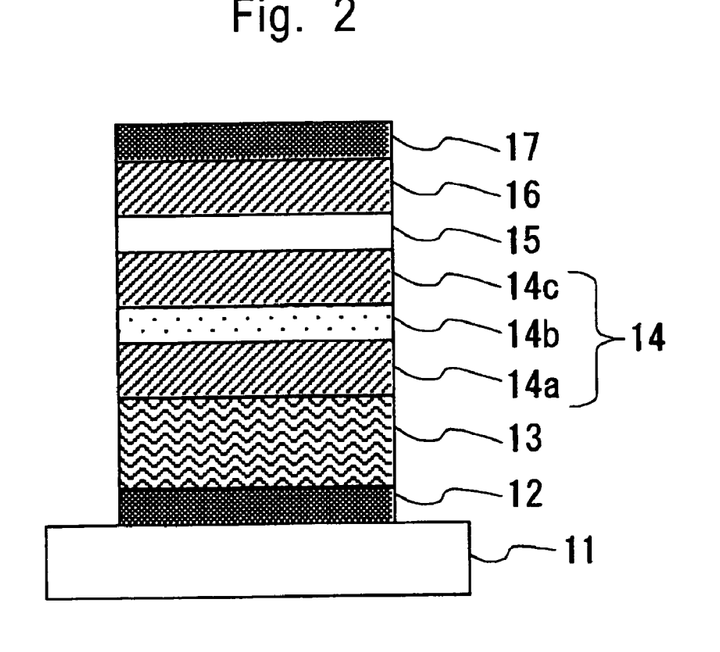
FIG. 2 is a schematic view showing the general configuration of a magnetoresistive element used in the magnetic memory device.

FIG. 1 is a schematic view showing the configuration of the principal part of a first embodiment of an MRAM to which the present invention is applied, and FIG. 2 is a schematic view showing the general configuration of a TMR element used in the MRAM.

First, a TMR element will be described. A TMR element includes a free layer composed of a ferromagnetic material, a nonmagnetic layer composed of an insulating material, a fixed layer composed of a ferromagnetic material, and an antiferromagnetic layer for directly or indirectly fixing the direction of magnetization of the fixed layer, the layers being stacked in order. The TMR element records information by using the change in direction of magnetization of the free layer, and the resistance of a tunnel current varies depending on the direction of magnetization.

More specifically, for example, the TMR element has a layered structure in which a Ta film of 3 nm in thickness, a PtMn film of 30 nm in thickness, a CoFe film 14a of 1.5 nm in thickness, a Ru film 14b of 0.8 nm in thickness, a CoFe film 14c of 2 nm in thickness, an Al—Ox film of 1.5 nm in thickness, a NiFe film of 15 nm in thickness, and a Ta film of 5 nm in thickness are stacked in order on a substrate 11, as shown in FIG. 2. The film thicknesses are just examples, and are not limited to the above values.

In such a layered structure, the NiFe film functions as a free layer 16, the Al—Ox film functions as a nonmagnetic layer 15, and the PtMn film functions as an antiferromagnetic layer 13. A synthetic ferrimagnetic region in which the two CoFe films 14a and 14c are stacked with the Ru film 14b serving as a nonmagnetic layer therebetween functions as a fixed layer 14. The Ta films function as protective films 12 and 17.

While NiFe is used as the ferromagnetic material that forms the free layer and CoFe is used as the ferromagnetic material that forms the fixed layer, they may be replaced with any of Co, Ni, and Fe, an alloy containing at least one of the materials, or a multilayer film containing the materials. While PtMn is used as the antiferromagnetic layer, it may be replaced with NiMn as a similar ordered alloy, IrMn, RhMn, or FeMu as an unordered alloy, NiO or $\alpha$-$Fe_2O_3$ as an oxide.

While a so-called bottom-type TMR element, in which a fixed layer is deposited earlier (lower) than a free layer, is given as an example, of course, a so-called top-type TMR element in which a free layer is deposited earlier (lower) than a fixed layer may be used. Needless to say, this applies not only to the TMR element, but also to a GMR element in which a nonmagnetic layer disposed between a free layer and a fixed layer is composed of Cu or the like.

The configuration of the principal part of the MRAM having the above-described TMR element will now be described. As shown in FIG. 1, the MRAM described in this embodiment has a single TMR element 10. The TMR element 10 has a structure in which at least a fixed layer 14, a nonmagnetic layer 15, and a free layer 16 are stacked on a substrate 11, and more particularly, the above-described layer structure (see FIG. 2). The fixed layer 14 also functions as a lower electrode layer that generates a magnetic field to reverse the direction of magnetization of the free layer 16.

An electrode layer 22 composed of a nonmagnetic conductor is provided on the TMR element 10 in the figure, that is, on a side of the free layer 16 in the TMR element 10, with an insulating layer 21 composed of an insulating material therebetween. The electrode layer 22 functions as an upper electrode corresponding to the lower electrode layer, generates a magnetic field for reversing the direction of magnetization of the free layer 16, in a manner similar to that in the lower electrode layer, and is provided with a contact part adjacent to and out of contact with the free layer 16. That is, the electrode layer 22 is directly stacked on the free layer 16 in the contact part, and the insulating layer 21 is interposed between the free layer 16 and the electrode layer 22 in the other non-contact part.

The MRAM described in this embodiment is characterized in that a magnetic layer 23 made of a magnetic material is provided on the non-contact part of the surface of the electrode layer 22 adjacent to and out of contact with the free layer 16. The magnetic layer 23 is, for example, a NiFe film having a thickness of 10 nm. Besides NiFe, any of Co, Ni, and Fe, an alloy containing at least one of the materials, or a multilayer film containing the materials may be used. In any case, it is preferable that the coercive force of the magnetic layer 23 in a large area be equivalent to or less than the coercive force of the magnetic material used for the free layer 16. A nonmagnetic metal material, an insulating material, or the like may be interposed between the magnetic layer 23 and the electrode layer 22.

Figure 3:
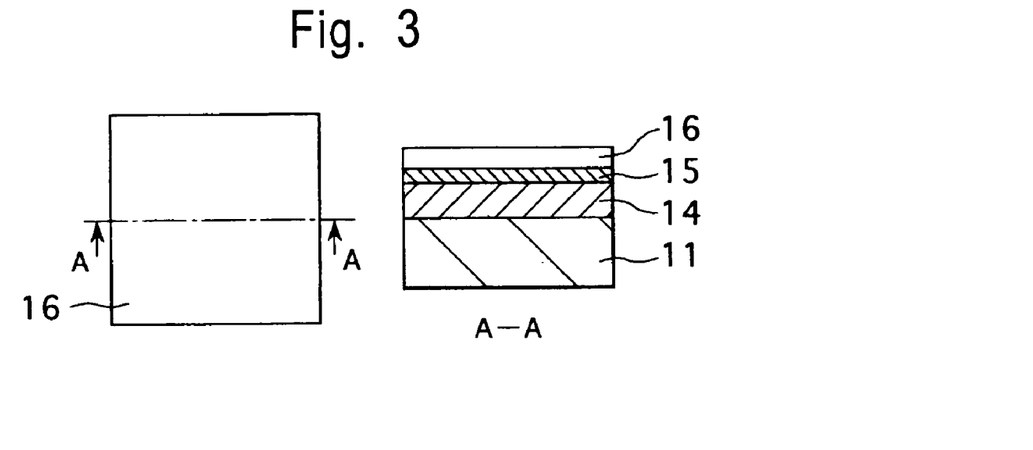
FIG. 3 is a (first) schematic view showing the outline of a procedure for producing the magnetic memory device according to the first embodiment of the present invention, more particularly, showing a step of depositing a magnetoresistive film.

A procedure for producing the MRAM having the above-described configuration will now be described. FIGS. 3 to 16 are schematic views showing the outline of the production procedure for the MRAM. In order to produce the MRAM having the above-described configuration, first, at least a fixed layer 14, a nonmagnetic layer 15, and a free layer 16 (more specifically, for example, the layered structure shown in FIG. 2) are sequentially deposited on a substrate 11 to form a TMR film, as shown in FIG. 3.

Figure 4:
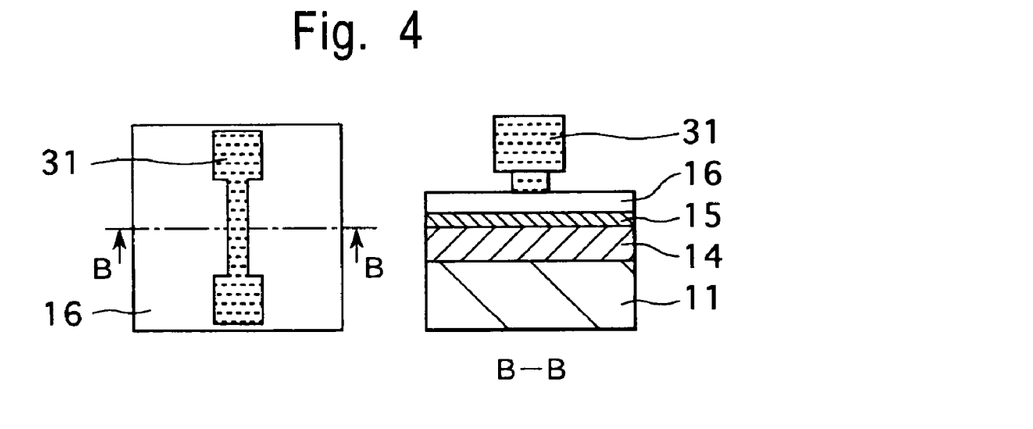
FIG. 4 is a (second) schematic view showing the outline of a procedure for producing the magnetic memory device according to the first embodiment of the present invention, more particularly, showing a step of patterning a lower electrode.
Figure 5:
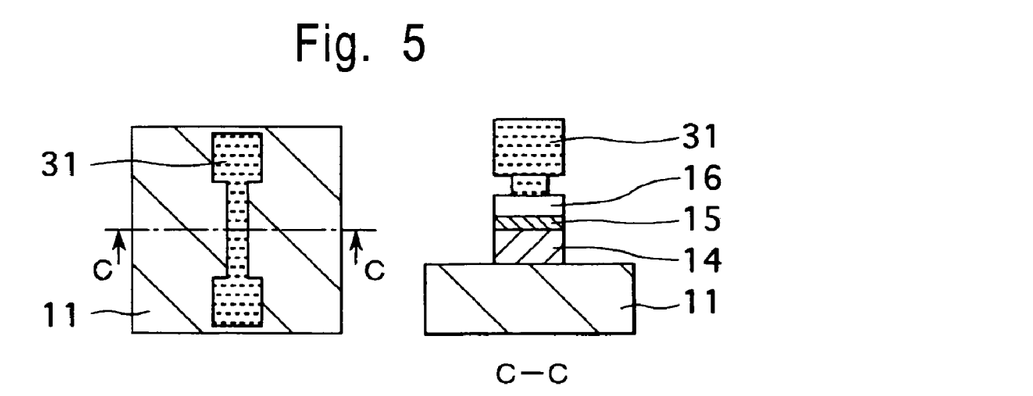
FIG. 5 is a (third) schematic view showing the outline of a procedure for producing the magnetic memory device according to the first embodiment of the present invention, more particularly, showing a step of etching the lower electrode.
Figure 6:
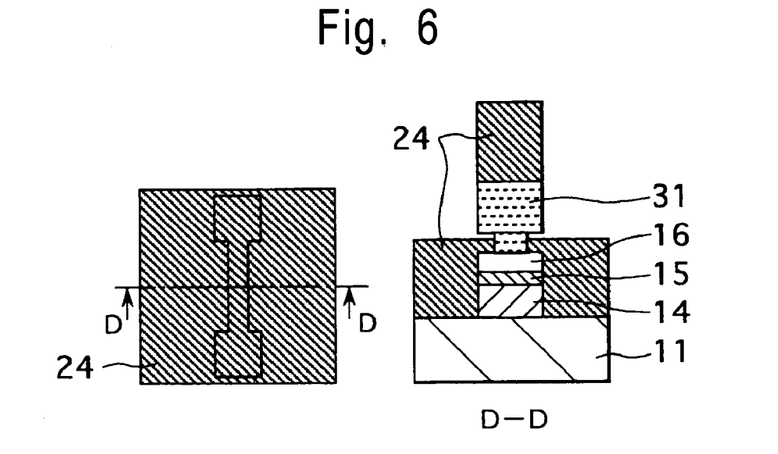
FIG. 6 is a (fourth) schematic view showing the outline of a procedure for producing the magnetic memory device according to the first embodiment of the present invention, more particularly, showing a step of depositing a lower-electrode burying insulating film.
Figure 7:
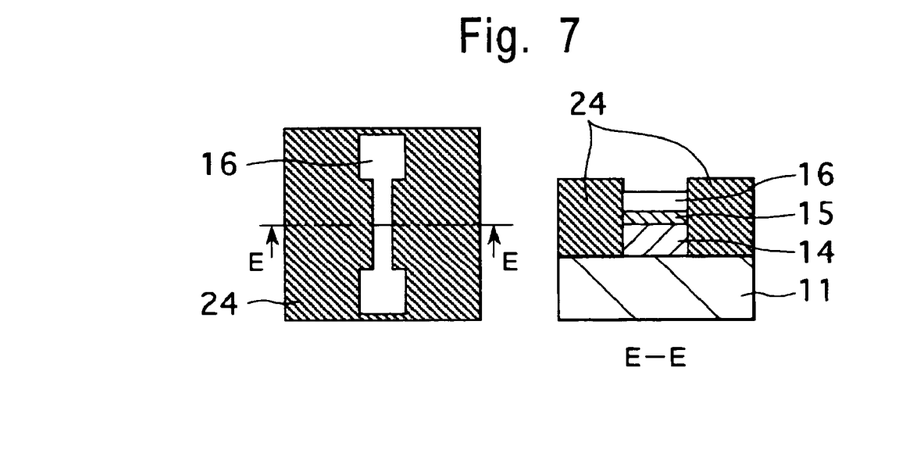
FIG. 7 is a (fifth) schematic view showing the outline of a procedure for producing the magnetic memory device according to the first embodiment of the present invention, more particularly, showing a lift-off step for the lower-electrode burying insulating film.

After the TMR film is formed, as shown in FIG. 4, a resist film 31 corresponding to patterning for forming a lower electrode layer is deposited on the free layer 16. Then, the fixed layer 14, the nonmagnetic layer 15, and the free layer 16 are partly removed by etching, as shown in FIG. 5, and an insulating layer 24 is deposited, as shown in FIG. 6. Subsequently, unnecessary portions are removed by using a so-called lift-off method, as shown in FIG. 7. In order to perform the lift-off, the resist film 31 has a two-layer structure in which the upper layer protrudes from the lower layer, as shown in FIG. 4, or an inversely tapered shape.

Figure 8:
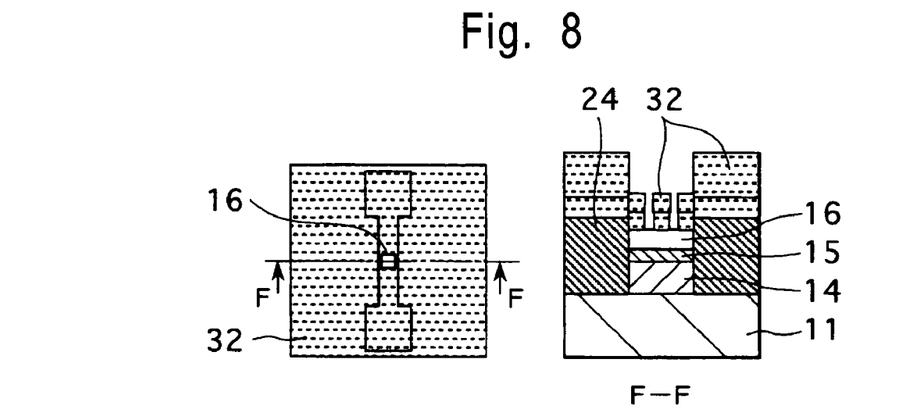
FIG. 8 is a (sixth) schematic view showing the outline of a procedure for producing the magnetic memory device according to the first embodiment of the present invention, more particularly, showing a step of patterning a magnetoresistive element section.
Figure 9:
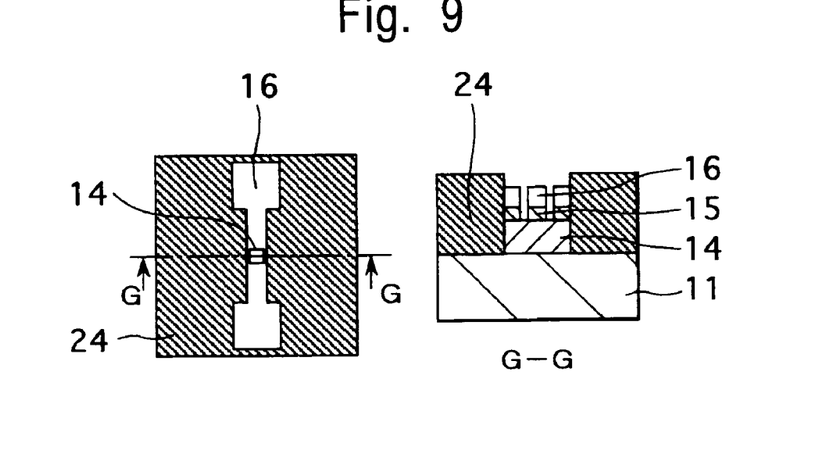
FIG. 9 is a (seventh) schematic view showing the outline of a procedure for producing the magnetic memory device according to the first embodiment of the present invention, more particularly, showing etching and resist-removing steps for the magnetoresistive element section.

After a lower electrode layer is buried by forming the insulating layer 24, a resist film 32 corresponding to patterning for a TMR element 10 is deposited on the free layer 16 and the insulating layer 24, as shown in FIG. 8. After the nonmagnetic layer 15 and the free layer 16 are partly removed by etching, the resist film 32 is removed, as shown in FIG. 9. Consequently, a section functioning as a TMR element 10 (almost the center portion in the figure) is formed.

Figure 10:
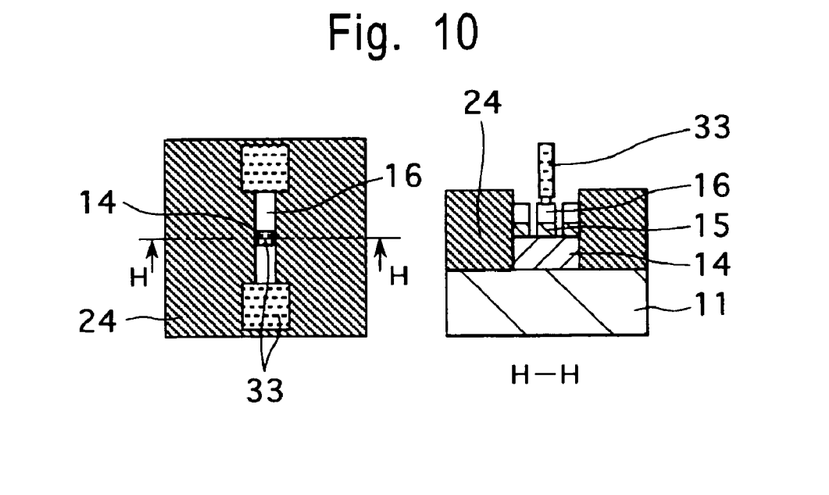
FIG. 10 is a (eighth) schematic view showing the outline of a procedure for producing the magnetic memory device according to the first embodiment of the present invention, more particularly, showing a step of patterning an electrode-connecting hole.
Figure 11:
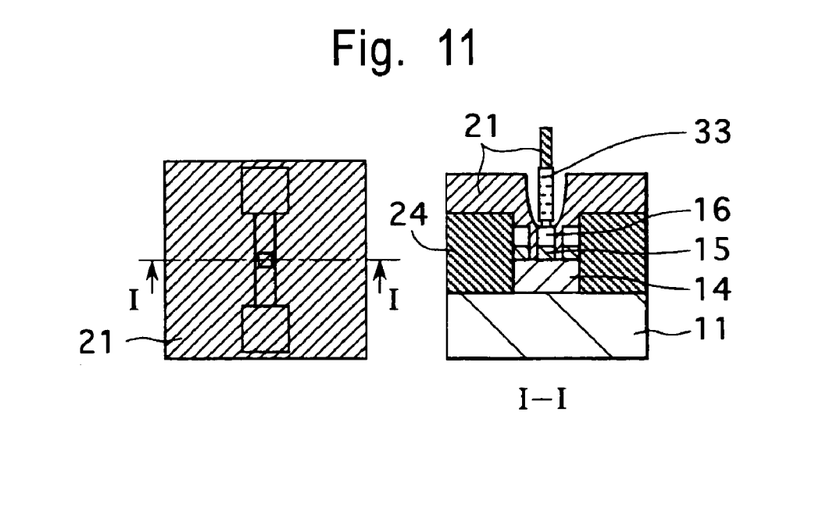
FIG. 11 is a (ninth) schematic view showing the outline of a procedure for producing the magnetic memory device according to the first embodiment of the present invention, more particularly, showing a step of a depositing an electrode-connecting-hole forming insulating film.

After the TMR element 10 is formed, a resist film 33 is deposited at a portion where an electrode-connecting hole is to be formed, as shown in FIG. 10. The resist film 33 also has a two-layer structure or an inversely tapered shape for the purpose of lift-off. Then, an insulating film 21 is deposited thereon, as shown in FIG. 11. The above processes are substantially similar to those in the general MRAM production procedure.

Figure 12:
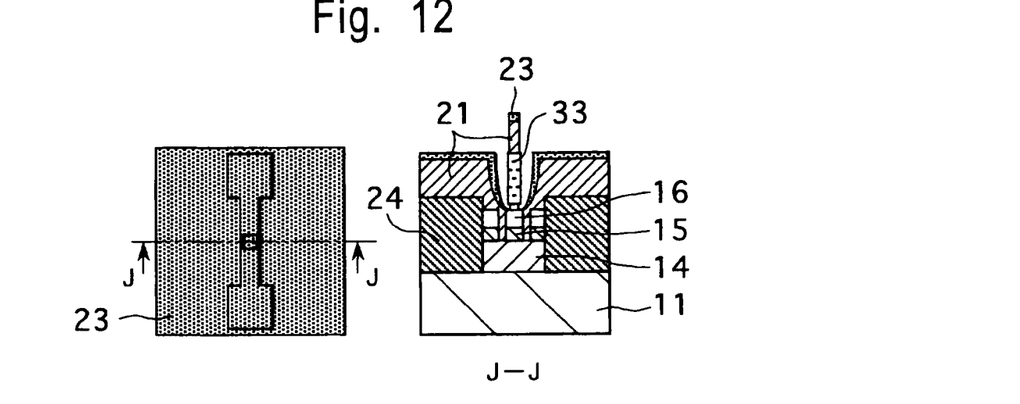
FIG. 12 is a (tenth) schematic view showing the outline of a procedure for producing the magnetic memory device according to the first embodiment of the present invention, more particularly, showing a step of depositing a magnetic layer.
Figure 13:
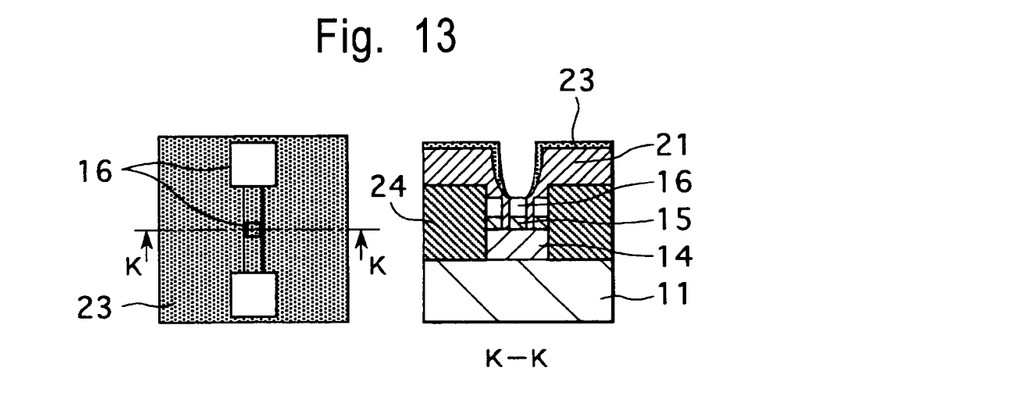
FIG. 13 is a (eleventh) schematic view showing the outline of a procedure for producing the magnetic memory device according to the first embodiment of the present invention, more particularly, showing a lift-off step for the electrode-connecting-hole forming insulating film and the magnetic layer.

When producing the MRAM described in this embodiment, as shown in FIG. 12, a magnetic layer 23 is deposited on the insulating layer 21. The magnetic layer 23 may be, for example, a NiFe film having a thickness of 10 nm, as described above. Then, unnecessary portions including the resist film 33 are removed by lift-off, as shown in FIG. 13. Consequently, the insulating layer 21 and the magnetic layer 23 are stacked outside the section functioning as the TMR element 10 (part in contact with the electrode layer 22) and the electrode-connecting hole of the TMR element 10 to be connected to the lower electrode layer. In the contact part, the free layer 16 of the TMR element 10 and the magnetic layer 23 can be brought into contact with each other or can be separated from each other by appropriately determining the shape of the resist film 33.

Figure 14:
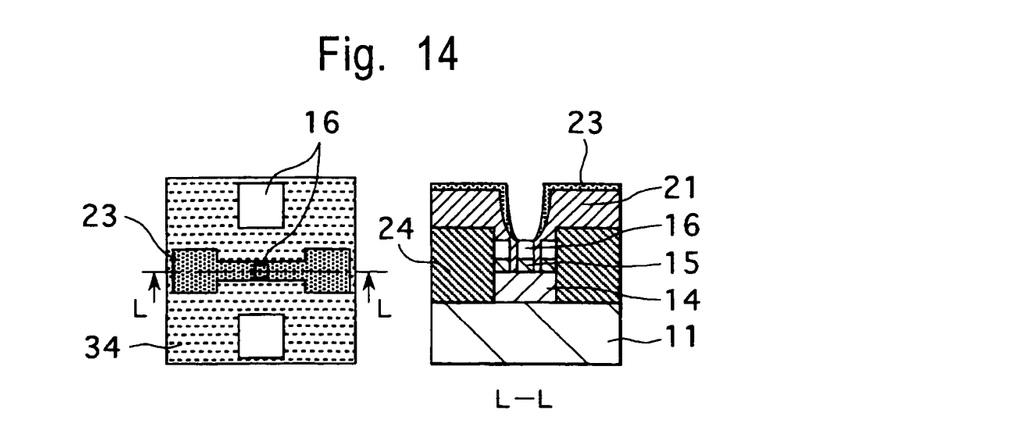
FIG. 14 is a (twelfth) schematic view showing the outline of a procedure for producing the magnetic memory device according to the first embodiment of the present invention, more particularly, showing a step of patterning an upper electrode.
Figure 15:
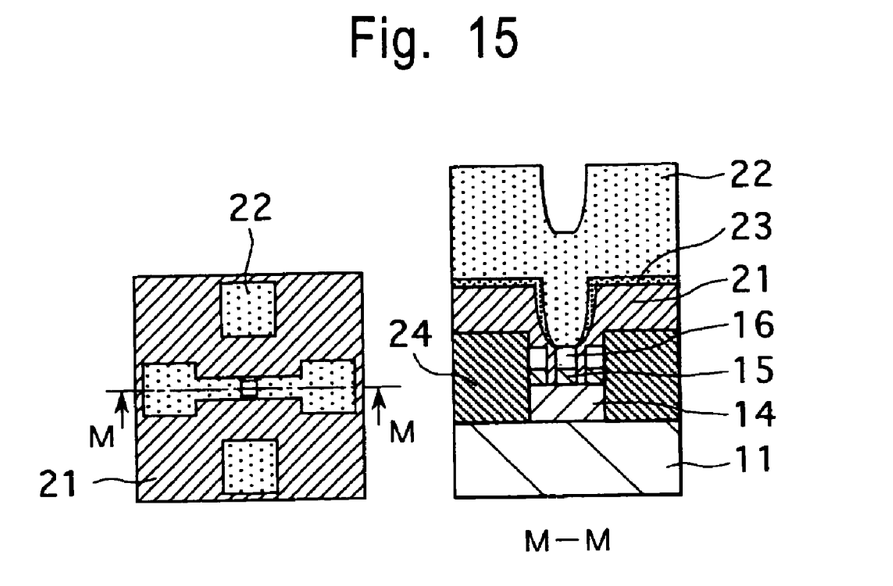
FIG. 15 is a (thirteenth) schematic view showing the outline of a procedure for producing the magnetic memory device according to the first embodiment of the present invention, more particularly, showing a deposition and lift-off step for the upper electrode, and an etching step for the magnetic layer.

After the insulating layer 21 and the magnetic layer 23 are formed, a resist film 34 corresponding to patterning for forming an electrode layer 22 is deposited, as shown in FIG. 14. Then, deposition of an electrode layer 22 and lift-off of the resist film 34 are performed, as shown in FIG. 15. However, since the magnetic layer 23 previously formed remains on the entire surface, an unnecessary portion of the magnetic layer 23 is removed by subsequently performing overall etching with the electrode layer 22 used as a mask. Therefrom, it is preferable that the thickness of the electrode layer 22 be determined in consideration of the amount of removal by etching. The unnecessary portion of the magnetic layer 23 may be removed not only by etching using the electrode layer 22 as a mask, but also by performing etching after a new resist pattern is formed.

Figure 16:
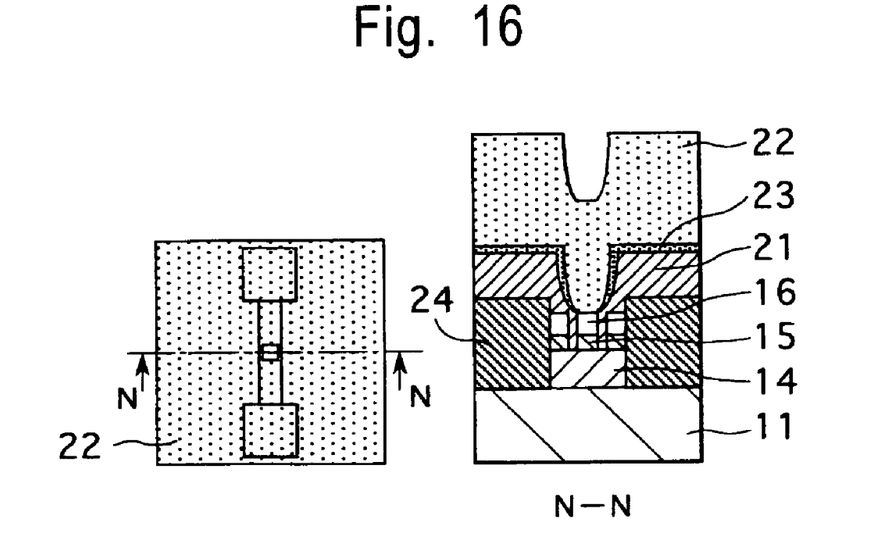
FIG. 16 is a (fourteenth) schematic view showing the outline of a procedure for producing the magnetic memory device according to the first embodiment of the present invention, more particularly, showing another example of a step of deposing the upper electrode.

Through such a production procedure, the obtained MRAM has the configuration shown in FIG. 1, that is, a configuration in which the magnetic layer 23 is provided on the part of the surface of the electrode layer 22 adjacent to and out of contact with the free layer 16. While the electrode layer 22 functioning as the upper electrode is formed by using the lift-off method (see FIG. 14), for example, an electrode layer 22 of a desired shape may be formed by performing etching after a material for the electrode layer 22 is deposited on the entire surface, as shown in FIG. 16. In this case, the magnetic layer 23 is removed by etching together with the electrode layer 22, which is different from the above case.

In the MRAM formed as described above, since the magnetic layer 23 is provided in the non-contact part between the free layer 16 and the electrode layer 22, magnetic poles generated at the ends of the free layer 16 are cancelled by the magnetic layer 23 disposed therearound, and the apparent area of the free layer 16 (magnetic layer) increases. Therefore, even when the size of the TMR element 10 is reduced, an antimagnetic field in the free layer 16 of the TMR element 10 will not increase.

Figure 17:
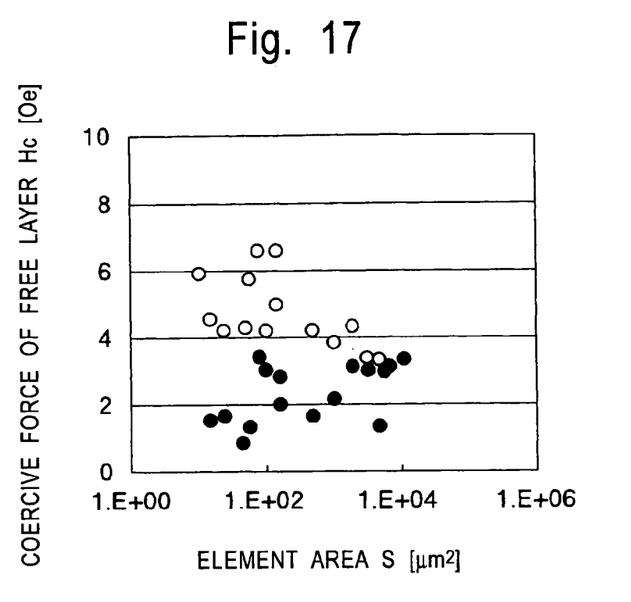
FIG. 17 is an explanatory view showing a concrete example of the dependency of the coercive force in a free layer on the element size.

FIG. 17 is an explanatory view showing concrete examples of the dependency of the coercive force of the free layer on the element size. The figure shows measurement examples of the dependency of the coercive force of the free layer 16 on the element size in a case in which the TMR element 10 is substantially square in plan view (see filled dots in the figure), and shows, for comparison, measurement examples in the case of a general type of MRAM having no magnetic layer 23 (see empty dots in the figure). As is evident from the figure, in the general configuration, the coercive force of the free layer increases as the element size decreases. In contrast, when the magnetic layer 23 is provided as in this embodiment, the tendency is reduced.

From the above, in the MRAM described in this embodiment, the tendency of the coercive force of the free layer 16 in the TMR element 10 to increase can be reduced even when the size of the TMR element 10 decrease. Moreover, the thickness of the free layer 16 need not be reduced for that purpose. That is, the increase in coercive force of the free layer 16 due to the demagnetizing field can be inhibited, regardless of the thickness, moment, and the like of the free layer 16. Therefore, in the MRAM of this embodiment, even when the size of the TMR element 10 is reduced, there is no need to increase the amount of current for switching the direction of magnetization of the free layer 16. As a result, information can be written in the TMR element 10 with a low power consumption.

[Second Embodiment]

Figure 18:
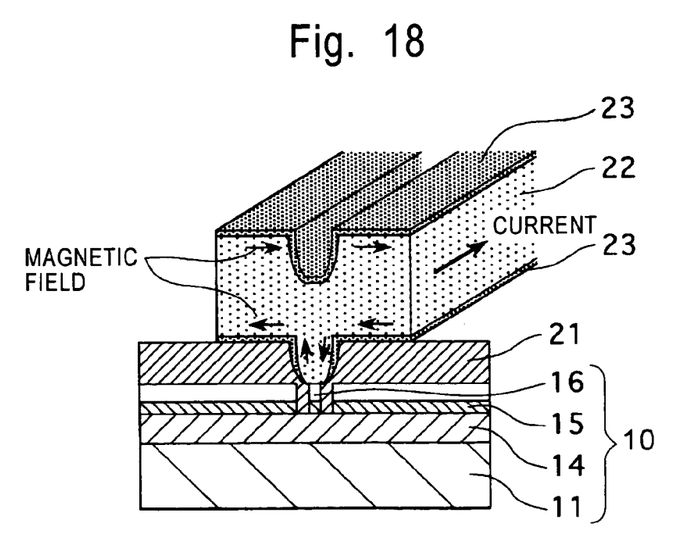
FIG. 18 is a schematic view showing the configuration of the principal part of a second embodiment of a magnetic memory device according to the present invention.

A description will now be given of a second embodiment of the present invention. FIG. 18 is a schematic view showing the configuration of the principal part of a second embodiment of an MRAM to which the present invention is applied. Herein, only differences from the above-described first embodiment will be described. In the figure, the same components as those in the first embodiment are denoted by the same reference numerals.

An MRAM described in this embodiment is substantially characterized in that a magnetic layer 23 is disposed not only on a surface of an electrode layer 22 close to a free layer 16, but also on an opposite surface, as shown in the figure. A magnetic layer 23 on the opposite surface is made of a magnetic material such as a NiFe film, in a manner similar to that in the magnetic layer 23 close to the free layer 16. A nonmagnetic metal material, an insulating material, or the like may be interposed between the magnetic layer 23 on the opposite surface and the electrode layer 22.

In order to produce the MRAM having the above configuration, after an electrode layer 22 is formed, magnetic layers 23 are deposited on the electrode layer 22, in a manner substantially similar to that in the first embodiment. Thus, it is possible to produce an MRAM having a configuration in which the magnetic layers 23 are provided on two opposite surfaces (upper and lower surfaces) of the electrode layer 22.

In the MRAM formed in this way, a magnetic field is generated by passing a current through the electrode layer 22 so as to perform switching of the TMR element 10, in a manner similar to that in the first embodiment. In this case, however, the magnetic layer 23 is provided not only on the side of the free layer 16 of the TMR element 10, but also on the opposite-side surface. Therefore, when a magnetic field is generated by passing a current through the electrode layer 22, the opposite-side magnetic layer 23 functions as a path for magnetic flux in the magnetic field. Since the magnetic field concentrates at the magnetic layers 23, spreading of the magnetic flux outside the electrode layer 22 can be minimized.

Therefore, in the MRAM described in this embodiment, the coercive force in the free layer 16 can be inhibited from being increased by a demagnetizing field, regardless of the thickness, moment, and the like of the free layer 16, and switching in the free layer 16 can be efficiently performed because of the concentration of the magnetic field. As a result, information can be written in the TMR element 10 with a small power consumption.

In addition, in the MRAM of this embodiment, the magnetic field can be concentrated only by adding one process for depositing the magnetic layer 23 to the processes in the first embodiment, a decrease in production efficiency can be minimized.

[Third Embodiment]

Figure 19:
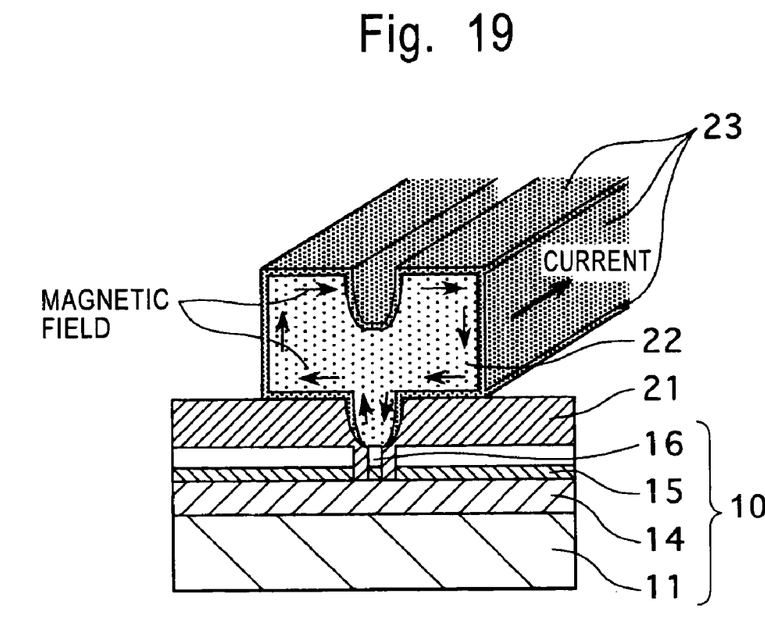
FIG. 19 is a schematic view showing the configuration of the principal part of a third embodiment of a magnetic memory device according to the present invention.

A third embodiment of the present invention will now be described. FIG. 19 is a schematic view showing the configuration of the principal part of a third embodiment of an MRAM to which the present invention is applied. Herein, only differences from the above-described first or second embodiment will be described. In the figure, the same components as those in the first embodiment are denoted by the same reference numerals.

An MRAM described in this embodiment is substantially characterized in that a magnetic layer 23 is provided to cover not only a surface of an electrode layer 22 close to a free layer 16, but also other surfaces, as shown in the figure. For example, when the electrode layer 22 is rectangular in cross section, a magnetic layer 23 is provided on the surface close to the free layer 16 and the other three surfaces. Of course, when the cross section of the electrode layer 22 is shaped like a polygon other than a rectangle, a magnetic layer 23 is provided on each of the surfaces other than the surface close to the free layer 16. The magnetic layer 23 on each surface is composed of a magnetic material such as a NiFe film, in a manner similar to that in the magnetic layer 23 close to the free layer 16. A nonmagnetic metal material, an insulating material, or the like may be interposed between the magnetic layer 23 on each surface and the electrode layer 22.

Figure 20:
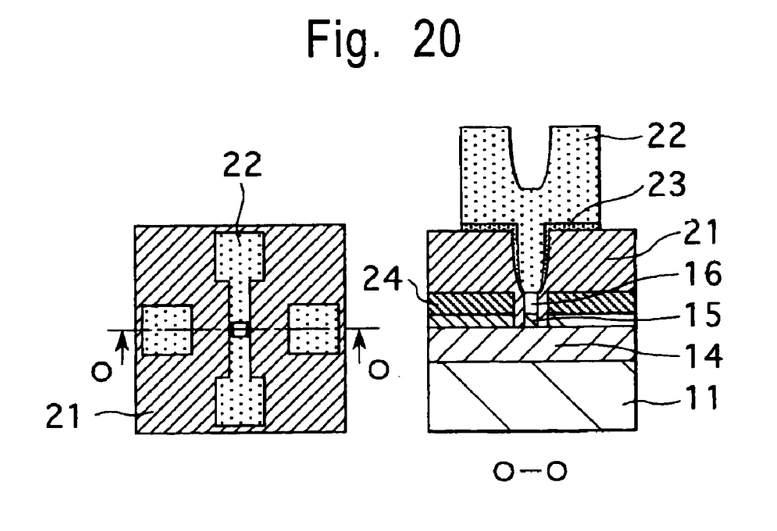
FIG. 20 is a (first) schematic view showing the outline of a procedure for producing the magnetic memory device according to the third embodiment of the present invention, more particularly, showing a step of depositing an upper electrode.
Figure 21:
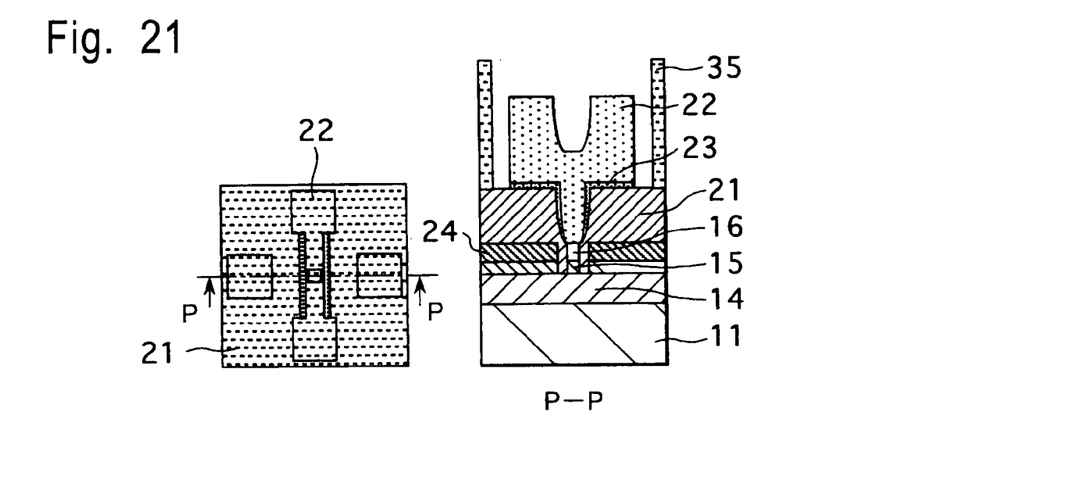
FIG. 21 is a (second) schematic view showing the outline of a procedure for producing the magnetic memory device according to the third embodiment of the present invention, more particularly, showing a step of forming a magnetic-layer lift-off pattern.
Figure 22:
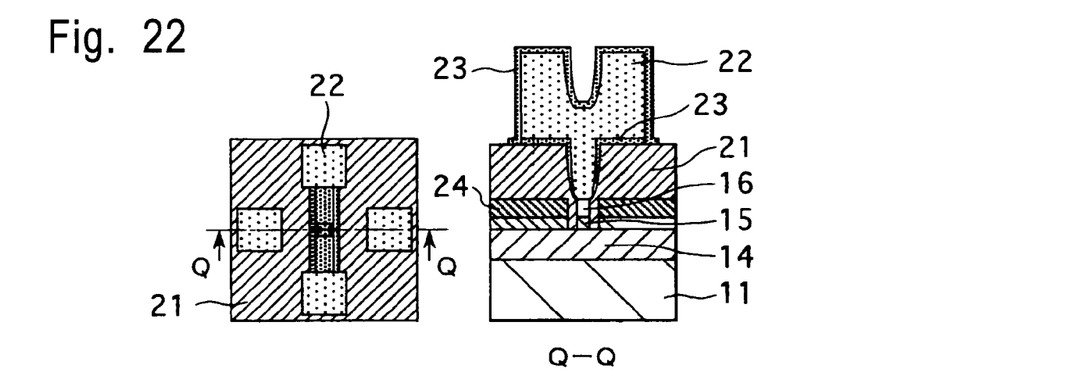
FIG. 22 is a (third) schematic view showing the outline of a procedure for producing the magnetic memory device according to the third embodiment of the present invention, more particularly, showing a deposition and lift-off step for a magnetic layer.

A procedure for producing the MRAM having the above configuration will now be described. FIGS. 20 to 22 are schematic views showing the outline of the production procedure for the MRAM. A process of forming an electrode layer 22 and preceding processes in the procedure for producing the MRAM having the above configuration are substantially similar to those in the first embodiment (see FIGS. 3 to 16). After the electrode layer 22 is formed, the electrode layer 22 and a magnetic layer 23 are partly (for example, side faces of the electrode layer 22 on which a new magnetic layer 23 is to be formed) removed by etching, as necessary, as shown in FIG. 20, and a resist film 35 corresponding to patterning for forming the new magnetic layer 23 is then deposited, as shown in FIG. 21. Subsequently, after a magnetic layer 23 is formed, unnecessary portions including the resist film 35 are removed by lift-off, as shown in FIG. 22. In this case, the magnetic layer 23 may be made of, for example, a NiFe film. Consequently, an MRAM can be formed in which a non-contact part of the surface of the electrode layer 22 adjacent to the free layer 16 and the other three surfaces are covered with the magnetic layer 23.

In the MRAM thus formed, the magnetic layer 23 also functions as a path for magnetic flux in the magnetic field, in a manner similar to that in the second embodiment. Therefore, the magnetic field concentrates at the magnetic layer 23, and spreading of the magnetic flux outside the electrode layer 22 is minimized. Moreover, since the magnetic layer 23 functioning as the path for the magnetic flux is provided to cover each surface of the electrode layer 22, the magnetic field is more effectively concentrated than in the second embodiment.

Accordingly, in the MRAM described in this embodiment, it is possible to inhibit the coercive force from being increased by a demagnetizing field in the free layer 16, and to more efficiently perform a switching operation in the free layer 16. As a result, a further reduction in power consumption during information writing can be expected.

While the present invention is applied to the MRAM having a single magnetoresistive element in the above-described first to third embodiments, the present invention is not limited thereto, and is also similarly applicable to, for example, an MRAM in which a plurality of magnetoresistive elements are arranged in a matrix.

Figure 23:
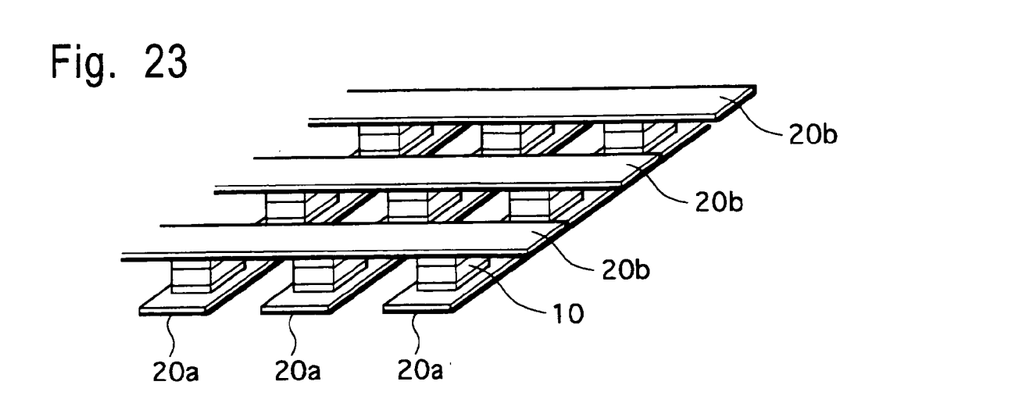
FIG. 23 is a schematic view showing the basic configuration of a magnetic memory device in which a plurality of magnetoresistive elements are arranged in a matrix.

FIG. 23 is a schematic view showing the basic configuration of an MRAM in which a plurality of magnetoresistive elements are arranged in a matrix. Such an MRAM includes word lines 20a and bit lines 20b intersecting with each other corresponding to rows and columns in which magnetoresistive elements 10 are arranged, as shown in the figure. The word lines 20a and the bit lines 20b cross the magnetoresistive elements 10 in the lengthwise and widthwise directions, so that the magnetoresistive elements 10 are vertically sandwiched between the word lines 20a and the bit lines 20b and are placed at the intersections of the lines.

Information is written in each magnetoresistive element 10 by controlling the direction of magnetization of the element with a combined magnetic field generated by passing a current through both a word line 20a and a bit line 20b. That is, a magnetic field for reversing the direction of magnetization in the magnetoresistive element 10 is given by combining magnetic fields passing through the word line 20a and the bit line 20b. The direction of magnetization of only a selected magnetoresistive element 10 is thereby reversed, and information is recorded. Since a magnetic field of only one of the word line 20a and the bit line 20b is applied to an unselected magnetoresistive element 10, the reversal of the magnetic field is insufficient, and information is not written.

In such an MRAM, one of the word line 20a and the bit line 20b provided closer to the free layer in the magnetoresistive element 10 corresponds to the electrode layer 22 described in the first to third embodiments. Therefore, when a magnetic layer 23 is provided along one of the word line 20a and the bit line 20b, although the magnetic layer 23 needs to be separated from a magnetic layer in the adjoining magnetoresistive element, the coercive force is inhibited from being increased by the demagnetizing field, and power consumption for information writing can be reduced, as described above, even when the size of each magnetoresistive element 10 is reduced to increase the memory packaging density.

As described above, in the magnetic memory device of the present invention, since an apparent area of the free layer is increased because of the magnetic layer provided on the part of the surface of the electrode layer adjacent to and out of contact with the free layer, even when the size of the magnetoresistive element is reduced, the demagnetizing field in the free layer will not increase. That is, the coercive force in the free layer can be inhibited from being increased by the demagnetizing field, regardless of the thickness, moment, and the like of the free layer. Therefore, even when the size of the magnetoresistive element is reduced, information can be written in the magnetoresistive element with a low power consumption.

What is claimed is:

1. A magnetic memory device comprising:
   a magnetoresistive element having a free layer composed of a ferromagnetic material; and
   an electrode layer composed of a nonmagnetic conductor, disposed adjacent to the free layer of the magnetoresistive element, and having a contact part in contact with the free layer,
   wherein the direction of magnetization of the free layer is reversed by a magnetic field generated by the electrode layer, and
   wherein a magnetic layer composed of a magnetic material is provided on a part of a surface of the electrode layer adjacent to and out of contact with the free layer.

2. A magnetic memory device according to claim 1, wherein a magnetic layer composed of a magnetic material is also provided on a surface of the electrode layer remote from the free layer.

3. A magnetic memory device according to claim 1, wherein each surface of the electrode layer other than the surface adjacent to the free layer is covered with a magnetic layer composed of a magnetic material.

* * * * *